(12) United States Patent
Fang et al.

(10) Patent No.: US 8,884,224 B2
(45) Date of Patent: Nov. 11, 2014

(54) CHARGED PARTICLE BEAM IMAGING ASSEMBLY AND IMAGING METHOD THEREOF

(75) Inventors: Wei Fang, Milpitas, CA (US); Jack Jau, Los Altos Hills, CA (US); Yan Zhao, San Jose, CA (US)

(73) Assignee: Hermes Microvision, Inc., Hsinchu (TW)

( * ) Notice: Subject to any disclaimer, the term of this patent is extended or adjusted under 35 U.S.C. 154(b) by 402 days.

(21) Appl. No.: 12/420,200

(22) Filed: Apr. 8, 2009

(65) Prior Publication Data

US 2010/0258722 A1 Oct. 14, 2010

(51) Int. Cl.
H01J 37/28 (2006.01)
H01J 37/30 (2006.01)
H01J 37/02 (2006.01)

(52) U.S. Cl.
CPC ........... H01J 37/28 (2013.01); *H01J 2237/004* (2013.01); H01J 37/026 (2013.01); *H01J 2237/0044* (2013.01); *H01J 2237/0048* (2013.01)
USPC ........... 250/311; 250/306; 250/307; 250/310; 250/492.2; 250/492.22

(58) Field of Classification Search
CPC . H01J 37/28; H01J 37/026; H01J 2237/0044; H01J 2237/0048; H01J 2237/1536
See application file for complete search history.

(56) References Cited

U.S. PATENT DOCUMENTS

| | | | | |
|---|---|---|---|---|
| 6,066,849 A | * | 5/2000 | Masnaghetti et al. | ........ 250/310 |
| 6,344,750 B1 | * | 2/2002 | Lo et al. | .................... 324/754.22 |
| 6,570,154 B1 | * | 5/2003 | Masnaghetti et al. | ........ 250/310 |
| 6,586,733 B1 | * | 7/2003 | Veneklasen et al. | .............. 850/9 |
| 6,737,658 B1 | * | 5/2004 | Nakasugi et al. | ........ 250/492.22 |
| 6,803,572 B2 | * | 10/2004 | Veneklasen et al. | .............. 850/9 |
| 6,828,571 B1 | * | 12/2004 | McCord et al. | ............ 250/492.2 |
| 7,232,997 B2 | * | 6/2007 | Edinger et al. | ................ 250/311 |
| 7,560,939 B1 | * | 7/2009 | De et al. | .................... 324/754.22 |
| 7,817,105 B2 | * | 10/2010 | Kobaru et al. | ................... 345/10 |
| 7,884,334 B2 | * | 2/2011 | Zhao et al. | .................... 250/398 |
| 7,973,283 B2 | * | 7/2011 | Wang et al. | ................... 250/311 |
| 8,168,950 B2 | * | 5/2012 | Furuhashi et al. | ............ 250/310 |
| 2002/0027440 A1 | * | 3/2002 | Shinada et al. | ................ 324/751 |
| 2002/0149381 A1 | * | 10/2002 | Lo et al. | ....................... 324/751 |
| 2003/0169060 A1 | * | 9/2003 | Shinada et al. | ................ 324/751 |
| 2005/0205783 A1 | * | 9/2005 | Nagahama et al. | ........... 250/311 |

(Continued)

FOREIGN PATENT DOCUMENTS

JP  2008262882 A * 10/2008 ............. H01J 37/28

*Primary Examiner* — Michael Logie
(74) *Attorney, Agent, or Firm* — WPAT, PC; Justin King

(57) ABSTRACT

A method for enhancing the quality of a charged particle microscopic image of a sample is disclosed. The image is formed by a charged particle beam imaging system. The method comprising: scanning, using a first scanning beam, a surface of the sample in at least one first scan line; and scanning, using a second scanning beam, the sample surface in at least one second scan line, wherein said second scanning beam is scanned across said sample surface during a time interval between the end of said first scan lines and the beginning of the next said first scan lines. Application of the proposed method as a charged particle beam imaging system is also disclosed.

20 Claims, 9 Drawing Sheets

(56) References Cited

U.S. PATENT DOCUMENTS

| | | | |
|---|---|---|---|
| 2005/0230621 A1* | 10/2005 | Edinger et al. | 250/311 |
| 2006/0054816 A1* | 3/2006 | Bullock | 250/310 |
| 2007/0159662 A1* | 7/2007 | Kobaru et al. | 358/401 |
| 2009/0134340 A1* | 5/2009 | Furuhashi et al. | 250/398 |
| 2009/0206257 A1* | 8/2009 | Gunji et al. | 250/310 |
| 2009/0242760 A1* | 10/2009 | Miyamoto et al. | 250/307 |
| 2010/0072364 A1* | 3/2010 | Wang et al. | 250/307 |
| 2010/0181492 A1* | 7/2010 | Zhao et al. | 250/396 R |
| 2010/0294930 A1* | 11/2010 | Preikszas et al. | 250/307 |
| 2011/0032176 A1* | 2/2011 | Kobaru et al. | 345/10 |

* cited by examiner

CHARGED PARTICLE BEAM IMAGING ASSEMBLY AND IMAGING METHOD THEREOF

FIELD OF THE INVENTION

This invention relates to a charged particle beam imaging assembly and imaging method thereof, and more particularly a system and a method for enhancing the image quality of a charged particle beam imaging system.

BACKGROUND OF THE INVENTION

A charged particle beam imaging system uses a charged particle beam, called primary charged particle beam, to scan and impinge on the surface of a sample, and then collects the secondary charged particles emitted from the sample to form an image. For a given primary charged particle beam condition, the strength of secondary charged particle signal depends on surface topographical condition, material composition and local voltage distribution, thus the resulting image may reveal the surface topography, material contrast and/or voltage contrast.

A conventional charged particle beam imaging system generally includes a primary charged particle beam source which generates a charged particle beam, a condenser lens to condense the generated charged particle beam, an objective lens to focus the charged particle beam into a fine probe, a deflection unit to scan the fine probe over the sample held on a stage. The charged particle beam probe interacts with the sample to excite secondary charged particles which carry information of local topography, material, and potential of the sample. A detection unit collects these secondary charged particles to form an image of the sample. Proper sample surface charging condition is preferred for delivering a stable and uniform imaging of high contrast and high resolution. However, in some cases the charged particle beam itself may not be enough to create the preferred charging condition during imaging scanning, or the charged particle beam may induce severe surface charging which significantly deteriorates the image quality in the way of distortion, defocus, and/or lack of contrast for a neighboring subsequently imaged area. Thus, certain imaging methods with charging regulation before and after the imaging scanning, called pre-scan and post-scan respectively hereafter, have been developed and are important for the conventional charged particle beam imaging system.

Referring to FIG. 1, which is a charged particle beam imaging system 100 in accordance with the prior art. A primary charged particle beam is generated from a charged particle beam source 110 which may be, for example but not limited to, an electron beam gun. The primary charged particle beam is condensed by a condenser lens module 120 and focused by an objective lens module 130 to form a charged particle beam probe 140. A deflection unit 150 scans the charged particle beam probe 140 in lines across the surface of a sample 195 on a sample stage 190. It is noted that the one dimensional line scan can be converted to two dimensional raster by offsetting the beam center, or by moving the stage 190 properly in an orientation perpendicular to the line scan direction. After the bombardment of the charged particle beam probe 140 on the sample 195, secondary charged particles 160, for example but not limited to, secondary electrons, are emitted from the sample 195 and along with the backscattered charged particles, for example but not limited to, backscattered electrons, are collected by a charged particle detector 170. Since the amount of secondary charged particles are modulated by surface topography or voltage of scanned area, a two dimensional image representing the topography contrast or voltage contrast is obtained. The sample 195 may be a wafer, a mask or a semiconductor device and so on. It is noted that for simplicity of explanation, from here on the term charged particle "beam" and "beam probe" will be referring to the same beam which is defined as being substantially focused on the sample surface.

In general cases, charging will be induced on the scanned area by the primary charged particle beam and will accumulate if it cannot be released to ground quickly. Though proper level of charging of sample is preferred to deliver a voltage contrast image, excessive and none-uniform charging will result in adverse effects on image by distorting and/or defocusing the primary charged particle beam, so it is important to develop a method to regulate the surface charging initially existed or induced by previous imaging scanning.

There is an opposite situation where charging incurred by the primary charged particle beam during imaging scanning is too weak to produce an acceptable voltage contrast image, or the initial surface charging before image scanning is not uniform enough for providing an uniform image. Thus there is a need to have an additional step to regulate the surface charging condition, for example before the imaging scanning, and integrated into the image scanning process.

Currently, in some cases a general approach to regulate the sample surface charging condition is through a flood gun 180 to intentionally scan a separate charged particle beam, an optical beam or an electromagnetic radiation across the sample surface, so as to create a desired charging condition thereon. This operation is typically performed on a frame of image or wafer basis i.e. it treats the sample surface in a large area at one time. However, with such approach, when a subsequent imaging scanning operation is performed after the regulation, the established charging condition may have changed due to, for example, interaction of the regulated sample surface with the environment. In particular, the charging condition at the last regulated regions of the sample surface may have changed by the time the imaging scanning is performed thereto. As a result, the image quality of the obtained images may still not meet satisfaction.

Accordingly, a method is desired to control the surface charging condition of the sample in a more real time manner thereby rendering a more properly-controlled and uniform image quality.

SUMMARY OF THE INVENTION

A feature of this invention is to provide a method to regulate the sample surface charging for providing a stable, uniform, and sharp image during charged particle beam imaging. The disclosed method is also to enable repeatable and continuous imaging of the adjacent area without suffering the adverse effect of neighbor surface charging.

Another feature of this invention is to provide a charged particle beam imaging assembly capable of regulating surface charging on a sample during, before and/or after imaging scanning with charged particle beam.

In one embodiment of the present invention, a method for enhancing the quality of a charged particle microscopic image of a sample is disclosed. The image is formed by a charged particle beam imaging system. The method comprising: scanning, using a first scanning beam, a surface of the sample in at least one first scan line; and scanning, using a second scanning beam, the sample surface in at least one second scan line, wherein said second scanning beam is scanned across said sample surface during a time interval between the end of said first scan lines and the beginning of the next said first scan lines.

In another embodiment of the present invention, a charged particle beam imaging system capable of enhancing image quality during charged particle beam imaging of a sample is disclosed, which comprises: a scanning beam source, a deflection module, a stage, and a controller. The sample is secured on the stage for imaging. The scanning beam source is for generating at least a first scanning beam and a second scanning beam. The deflection module is for scanning the generated scanning beams across a surface of the sample. The controller is for coordinating the scanning beam source, the deflection module and the stage such that the sample surface is scanned in at least one first scan line by the first scanning beam, and then is scanned in at least one second scan line by the second scanning beam, wherein the second scanning beam is scanned across the sample surface during a time interval between the end of the previous first scan lines and the beginning of the next first scan lines.

BRIEF DESCRIPTION OF THE DRAWINGS

FIG. 6A illustrates a scan result in accordance with both of the embodiments respectively illustrated in FIG. 2A and FIG. 3a.

DESCRIPTION OF THE EXEMPLARY EMBODIMENTS

Figure 1:
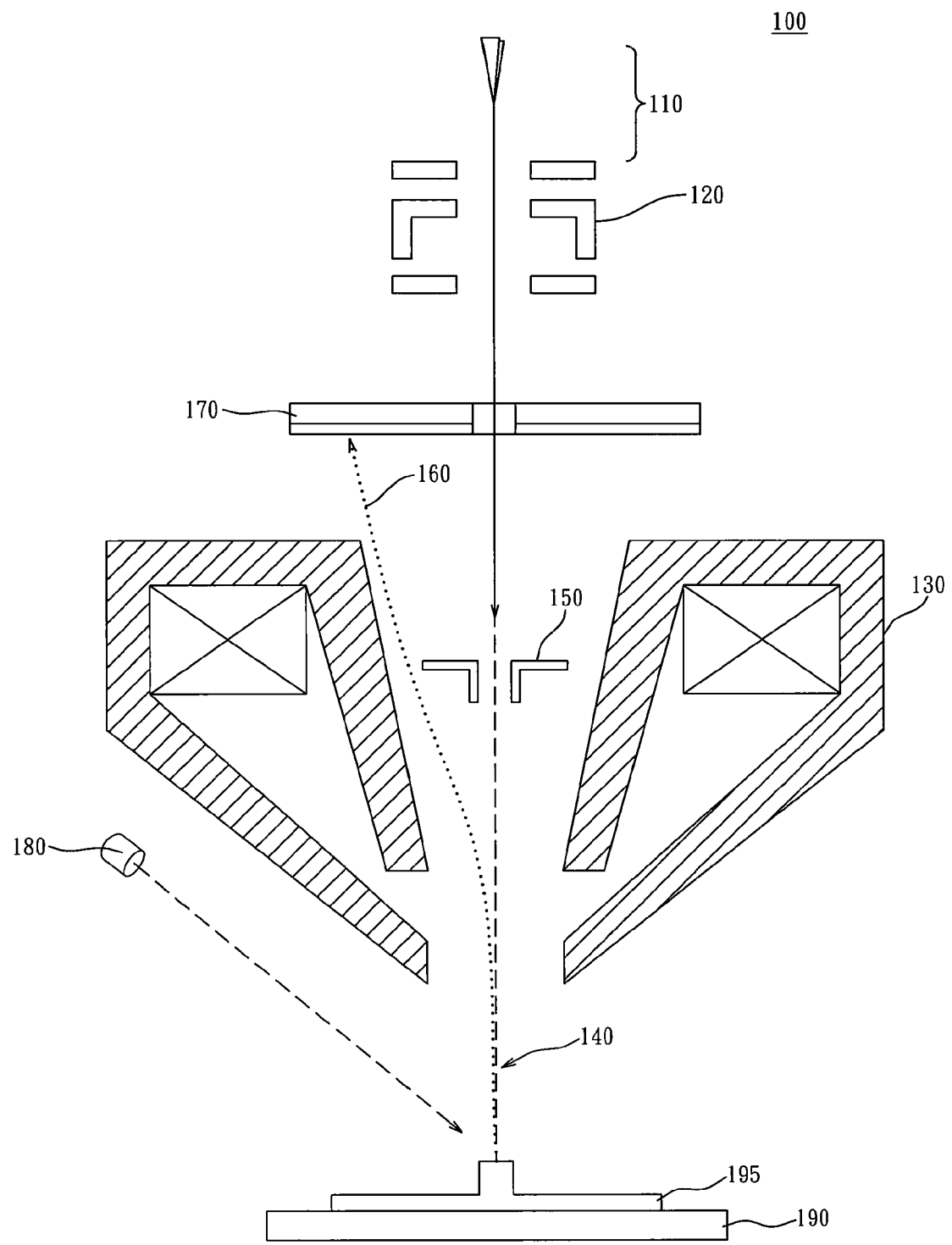
FIG. 1 is a charged particle beam imaging system in accordance with the prior art.

Charging can be regulated in various ways, such like exposure to air of certain humidity level, wet cleaning, exposure to ionizer, etc. To be compatible with charged particle beam imaging assembly which usually operates in a closed environment of vacuum, energized beams are used to remotely access the sample surface and render a preferred surface charging instantaneously before and/or after each group of imaging scan lines. In some occasions the charging conditioning beams may also be applied at the same time while the imaging scan lines are being formed. The energized beam can be a charged particle (electron or ion) beam, optical beam, or electromagnetic radiation, or any combinations thereof. It is noted that in practice the imaging and regulating scanning beams may be scanned across the same or different locations on the sample, but in either case the effective coverage area of the regulating scanning beam should at least cover the previous imaging scan line(s) and/or the next line(s) to be imaging-scanned, so as to regulate the surface charging of the sample thereby rendering a better image quality for the subsequent imaging scanning.

In one embodiment of the present invention, a scanning method for charged particle beam imaging of a sample is provided. The scanning method includes alternately scanning a sample surface using a first energized beam probe and a second energized beam probe. For example, one scanning operation may be performed by using one of the first and second energized beam probes to image the sample surface, and then another scanning operation is performed by using the other of the first and second energized beam probes to erase the surface charging generated by the previous imaging scanning operation. Such operation sequence will hereinafter be called post-scan charging regulation. In another example, one scanning operation is performed by using one of the first and second energized beam probes to set the surface charging condition to a desired level, and then another scanning operation is performed by using the other of the first and second energized beam probes to image the sample. Such operation sequence will hereinafter be called a pre-scan charging regulation. Regardless of the pre-scan or post-scan, the regulating and imaging scanning operations are alternately repeated.

The imaging scanning operation can be performed by using either the first or second energized beam probe. For charged particle beam imaging systems, the energized beam probe used for imaging must be a charged particle beam probe, for example an electron or ion beam probe. Once the imaging beam probe is selected, the other energized beam probe will be used for regulating, for example canceling or enhancing the sample surface charging condition. This regulating beam probe however, may be a charged particle (electron or ion) beam, optical beam, or electromagnetic radiation, or any combination thereof. It is noted that as would be understood by those skilled in the art, if the two beam probes are of the same type, for example an electron beam or ion beam probe, they may originate from the same or different beam sources. Furthermore, if they are from the same beam source, they may differ from one another in at least one of the beam conditions such as beam landing energy, beam current density, beam focus, beam spot size, beam incident angle at sample surface, etc., so that they can carry out their respective functions of imaging and regulating scans.

The first and second energized beam probes may induce a first surface charging condition and a second surface charging condition to the sample, respectively. Here, the charging condition refers to the sign and quantity of an accumulated electric charge induced by the scanning beam probe. It is noted that the "first" and "second" charging conditions (as well as the first and second scanning energized beam probes) are only referring to the order in time of their appearance. In other words, the first scanning beam probe, be it an imaging or regulating beam probe, induces a first charging condition on the sample surface, and then the second scanning beam probe, be it a regulating or imaging beam probe, induces a second charging condition on the sample surface.

The interaction between the first and second charging condition on the sample surface essentially depends on the electric charge polarity carried by individual charging conditions. For example, if the first and second charging conditions carry the same electric charge polarity, then the second charging condition could, in terms of the quantity and sign of the electric charge, enhance, mitigate or have no effect on the first charging condition. On the contrary, if the first and second charging conditions carry a different electric charge polarity, for example a positive vs. negative electric charge polarity, a positive/negative vs. neutral electric charge polarity, etc., then the second charging condition could, in terms of the quantity and sign of the electric charge, mitigate, neutralize or reverse the first charging condition.

For example, in the post-scan mode operation, the second charging condition is produced to regulate the first charging condition. After the effect of the second charging condition is delivered to the first charging condition, a net charging condition will form on the sample surface. The quality of a next image to be formed by the imaging beam probe (which is the first beam probe in this case) will be improved due to the existence of this net charging condition on the sample surface. In one embodiment, the second charging condition is substantially equal to the net charging condition. A number of example situations are listed in Table 1 for better explanation of the regulation of the first charging condition by the second charging condition in a post-scan mode operation.

or the second charging condition may have an electric charge polarity different than that of the first charging condition. When both charging conditions have the same electric charge polarity, the second charging condition may enhance, mitigate or have no effect on the first charging condition. When the two charging conditions have a different electric charge polarity, the second charging condition may mitigate, eliminate (neutralize) or reverse the first charging condition.

It is noted that although a specific scenario of a post-scan mode operation with a positive first charging condition has been given here as an example, similar rationing can be applied to other scenarios as well, such as a pre-scan mode operation with a positive first charging condition, a post-scan mode operation with a negative first charging condition, a pre-scan mode operation with a negative first charging condition, a post-scan mode operation with a neutral first charging condition, a pre-scan mode operation with a neutral first charging condition, etc.

TABLE 1

| $1^{st}$ charging condition | voltage of the $1^{st}$ charging condition ($V_i$) (volt) | $2^{nd}$ charging condition | net charging condition (In comparison to $1^{st}$ charging condition) | voltage of net charging condition ($V_n$) (volt) | Effect of $2^{nd}$ charging condition on $1^{st}$ charging condition |
|---|---|---|---|---|---|
| positive | $V_i$ (>0) | positive | more positive | $V_n > V_i$ | Enhancing |
| positive | $V_i$ | positive | unchanged | $V_n = V_i$ | no effect |
| positive | $V_i$ | positive | less positive | $V_n < V_i$ | Mitigating |
| positive | $V_i$ | negative | less positive | $V_n < V_i$ | Mitigating |
| positive | $V_i$ | negative | neutral | $V_n = 0$ | eliminating (neutralizing) |
| positive | $V_i$ | negative | negative | $V_n < 0$ | Reversing |

For example, when imaging the sample, an imaging first scanning beam probe induces a first charging condition of accumulated positive charges of 5 volts on the sample surface. Then, a regulating second scanning beam probe is scanned across the sample surface to regulate the generated first charging condition by introducing a second charging condition to the sample surface which interacts with the first charging condition, resulting in a net charging condition on the sample surface. Assuming the second charging condition has the same electric charge polarity as the first charging condition, then if the net charging condition is higher than 5 volts, such as 10 volts, the second charging condition is deemed to have enhanced the first charging condition; if the net charging condition is still measured to be 5 volts, the second charging condition is deemed to have had no effect on the first charging condition; if the net charging condition is lower than 5 volts, such as 2 volts, the second charging condition is deemed to have mitigated the first charging condition. On the other hand, for the case that the second charging condition has an electric charge polarity different than the first charging condition, if the net charging condition still has the same electric charge polarity as the first charging condition but less in quantity, such as 2 volts, the first charging condition is deemed to have been mitigated by the second charging condition; if the net charging condition is measured to be 0 voltage, the first charging condition is deemed to have been eliminated (neutralized) by the second charging condition; if the net charging condition has an opposite electric charge polarity to the first charging condition, such as −2 volts, the first charging condition is deemed to have been reversed by the second charging condition.

In summary, the second charging condition may have the same electric charge polarity as the first charging condition, In one embodiment, the imaging operation is performed by using the first energized beam probe which is a charged particle beam probe such as an electron beam or ion beam. In addition, the scanning operation of the second energized beam probe, which may be a charged particle beam, can be performed during a beam retrace period so as to regulate the sample surface charging condition. In one example of this embodiment, the beam retrace period is defined as a time interval between two imaging scan lines formed by the imaging charged particle beam probe. During the beam retrace period, the imaging beam probe is directed from the end point of a previous imaging scan line formed to the starting point of a next imaging scan line to be formed. No imaging scanning operation is performed during the beam retrace period.

In one example of the above embodiment, the first energized beam and the second energized beam both are a charged particle beam and are originated from the same source. In such case, the two beams may differ in the beam condition such as the beam landing energy, beam current density, beam focus, beam spot size, beam incident angle at sample surface, etc., wherein in one example the beam spot size is measured by the diameter of the beam probe spot when colliding with the sample.

Figure 5:
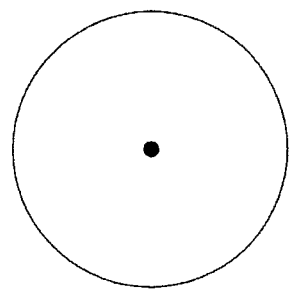
FIG. 5 illustrates a comparison of an ideal beam spot an a real beam spot of a charged particle beam in accordance with an embodiment of the present invention.

In another example of the above embodiment, the first energized beam and the second energized beam both are the same kind of charged particle beam but originated from different sources. In this example, the first charged particle beam and second charged particle beam may differ in the beam condition such as the beam landing energy, beam current density, beam focus, beam spot size, beam incident angle at sample surface, etc., wherein in one example the beam probe spot size is measured by the diameter of the beam probe spot when colliding with the sample. By the way, it should be well-known by those skilled in the art that an ideal beam spot is usually assumed a concentrated spot as the internal spot illustrated in FIG. 5, however, a real beam spot is always formed as a radiation beam spot as the area enclosed b the external circle illustrated in FIG. 5.

Figure 2A:
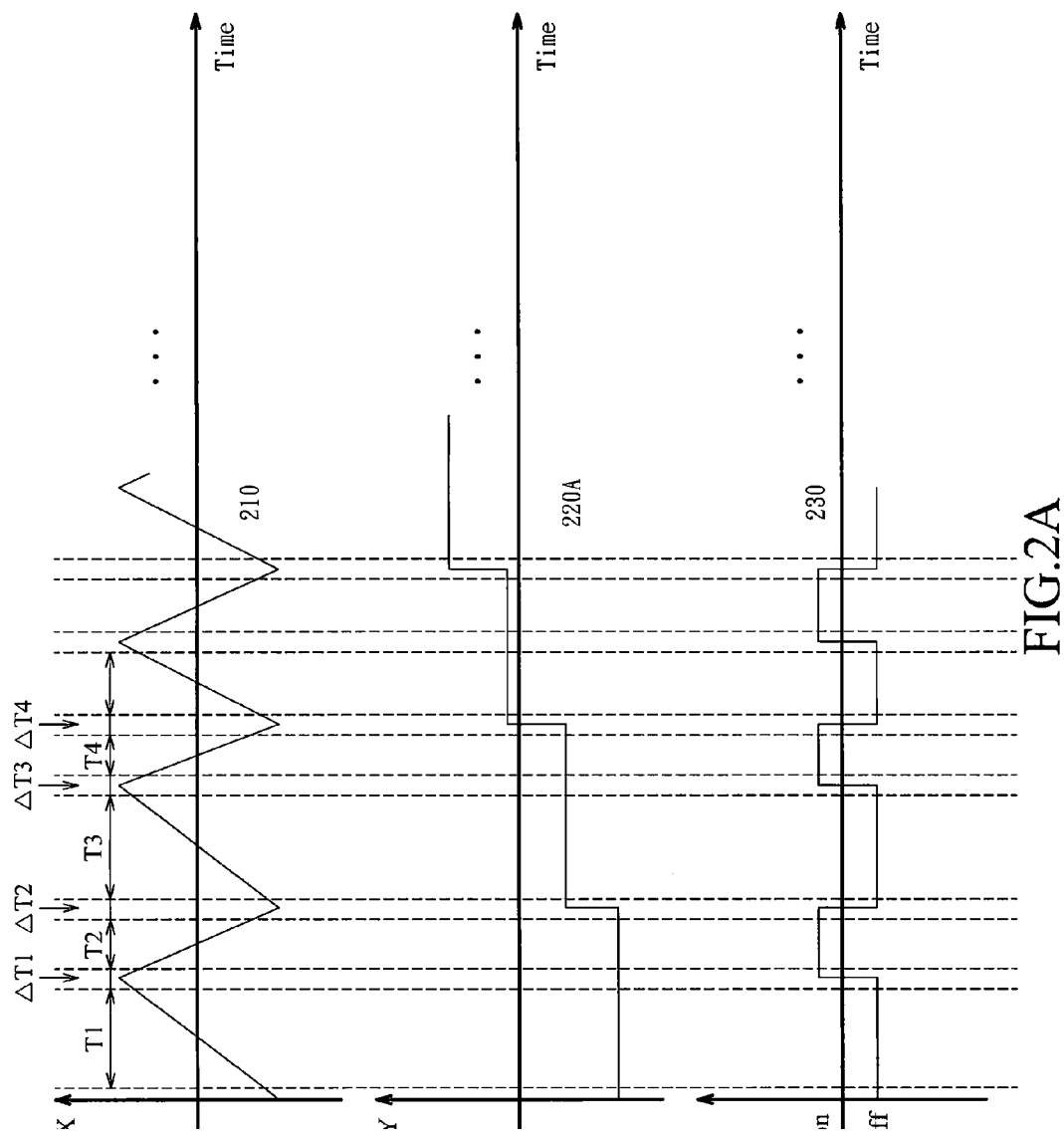
FIG. 2A to FIG. 2C illustrate the time sequence of triggering signals for the imaging scan, charging regulating scan and scan line offset in accordance with embodiments of the present invention.
Figure 2B:
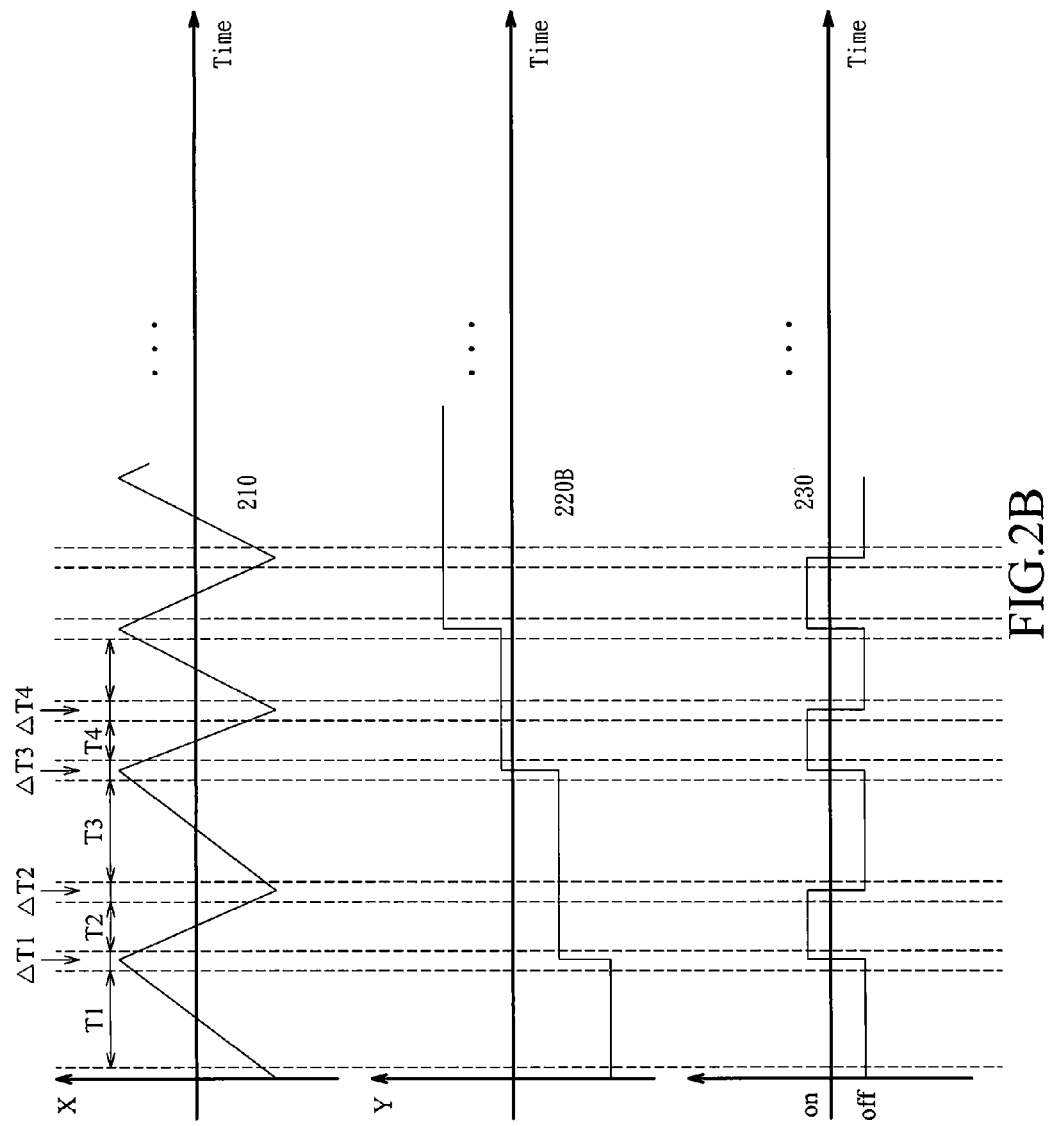
Figure 3A:
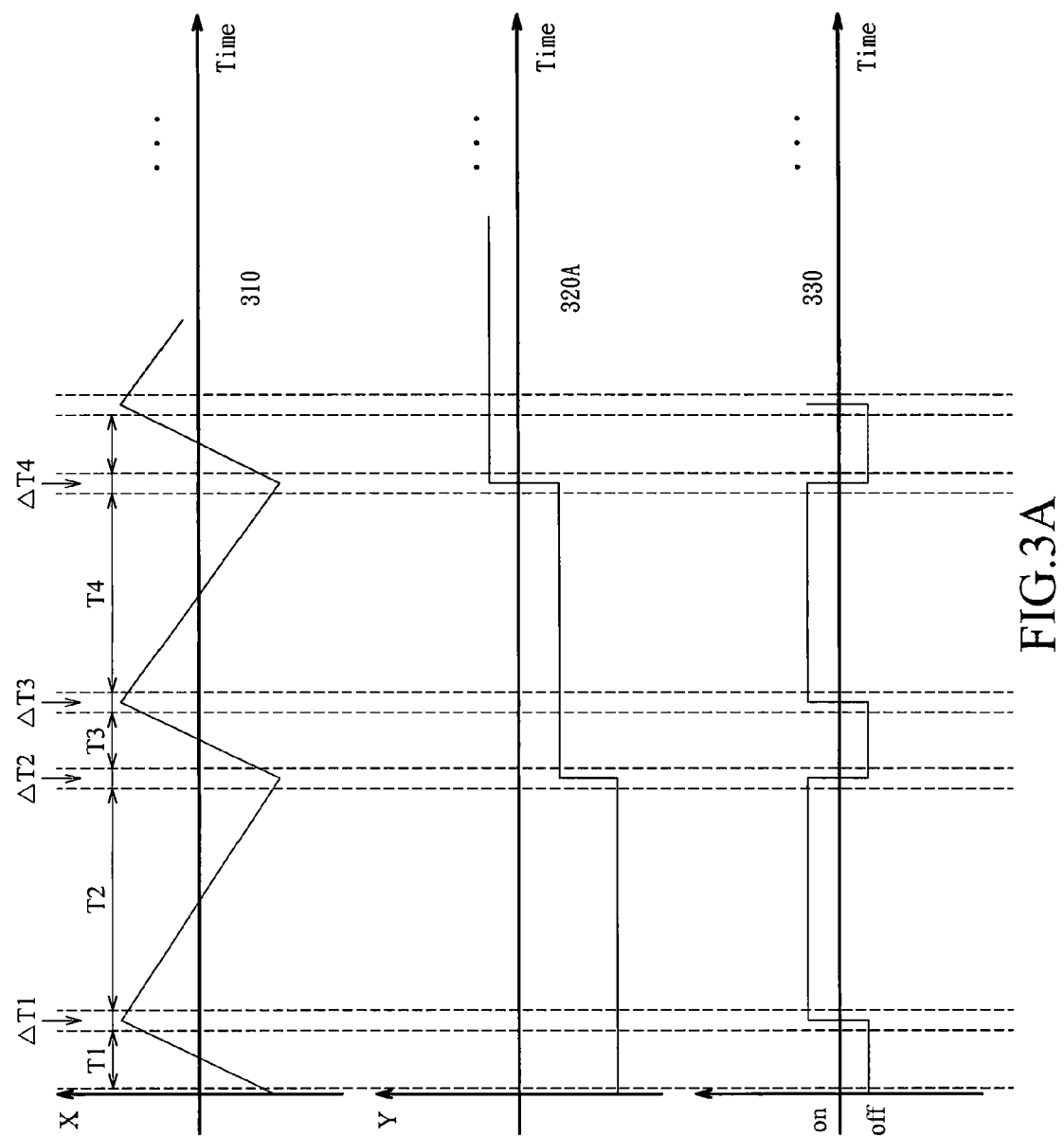
FIG. 3A and FIG. 3B illustrate the time sequence of triggering signals for the imaging scan, charging regulating scan and scan line offset in accordance with embodiments of the present invention.
Figure 6A:
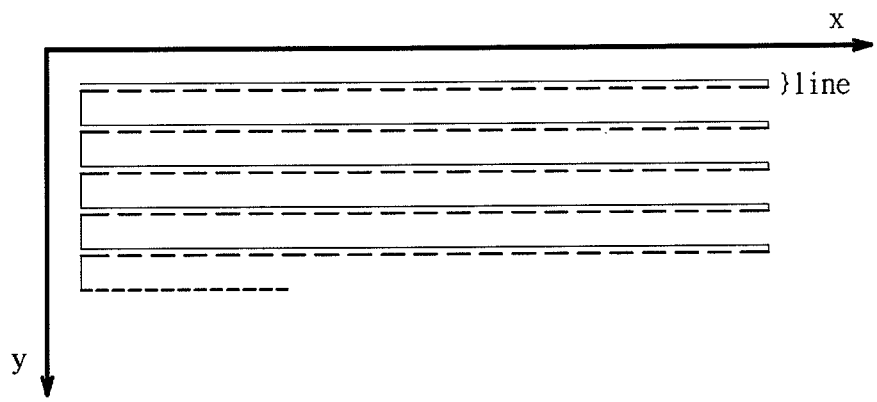
Figure 6B:
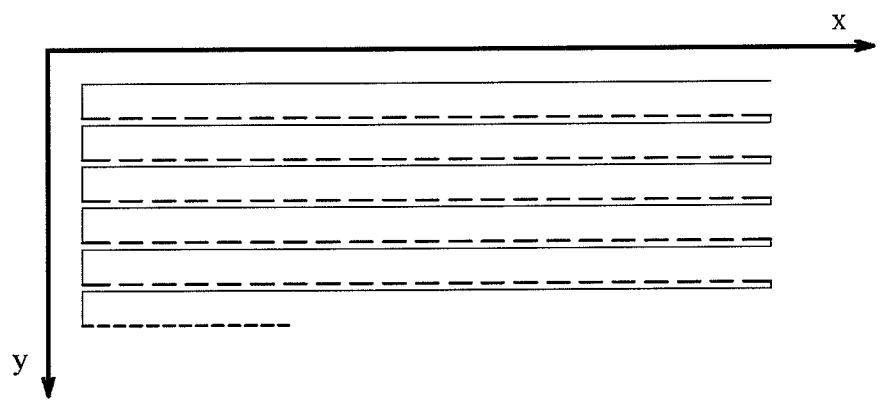
FIG. 6B illustrates a scan result in accordance with the embodiment illustrated in FIG. 2B.

Referring to FIGS. 2A, and 2B, which illustrate the time sequence of triggering signals for the imaging scan, charging regulating scan and scan line offset in accordance with an embodiment of the present invention. In addition, FIG. 6A illustrates a scan result in accordance with both of the embodiments respectively illustrated in FIG. 2A and FIG. 3A, and FIG. 6B illustrates a scan result in accordance with the embodiment illustrated in FIG. 2B, wherein the continuous lines represent the imaging scan steps, while the dashed lines represent the regulating scan steps, and each one of the continuous lines and a nearest one of the dashed lines included in the same "line" are overlapped in actual but represented as slightly apart for more clear illustration merely. The illustrated triggering signals include a line scan signal 210, a line-to-line offset signal 220A/220B and a regulating scan activation signal 230. Line scan signal 210 is for repeatedly scanning a scanning beam probe (which may be referred to as the first scanning beam hereinafter for convenience of description) in lines across the sample surface, whereby a scan swath is formed extending along the x direction, which will be defined hereinafter as being along the line scan direction, at a fixed y position, where the y direction will be defined hereinafter as being along the stage moving direction. Line-to-line offset signal 220A/220B is for moving the sample stage and/or the beam center (for example by using a beam deflection apparatus) in a direction substantially perpendicular to the direction of scan lines to carry out the line-to-line offset. Regulating scan activation signal 230 is for triggering the scanning operation of a regulating beam probe (which may be referred to as the second scanning beam hereinafter for convenience of description) to scan over the sample surface. In practice, the regulating beam can be different from the imaging beam or the same as the imaging beam but of a different beam condition. In the former case, regulating scan activation signal 230 is also for blanking the imaging beam probe so it is not projected on the sample surface during charging regulation. Alternatively, the two beams may both be scanned across the sample surface during charging regulation, but the regulating effect of the (second) regulating beam must be stronger than the imaging effect of the (first) imaging beam, such that the effect of the imaging beam is negligible. In the later case, regulating scan activation signal 230 is also for changing the beam condition of the imaging beam so it becomes a regulating beam probe which is able to carry out the charging regulation effect. The bold arrows pointing to the right represent a time axis. It is noted that in both figures the scanning operation is repeatedly performed until a frame of image of the sample is formed, as illustrated by the dots on the right.

As shown, one complete saw tooth shaped line scan signal 210 includes a forward slope and a backward slope. The elapsed time period during which scan line signal 210 is triggered comprises time periods T1, T2, T3, etc. and transition periods $\Delta T1$, $\Delta T2$, $\Delta T3$, etc. In this embodiment, within one saw tooth signal 210, the time duration of the forward slope signal is selected to be for the imaging scanning operation, and that of the backward slope signal is for beam retracing. As would be understood by those skilled in the art, the opposite arrangement is also a practical implementation. On the other hand, the triggered regulating scan activation signal 230 indicates the starting time point and duration of the surface charging regulation by irradiating or scanning the regulating beam probe on the sample surface.

To obtain a two dimensional image of the sample, each line on the sample surface to be imaging-scanned must lie adjacent to one another along the y-direction. This line to line displacement can be achieved by the line offset signal 220A/220B through driving the stage to move stepwise along the y-direction, or through driving a beam deflection apparatus to offset the imaging beam stepwise along the y-direction until all lines designated to be imaging-scanned are scanned. The regulating scan activation signal 230 can be triggered during the transition time period, for example $\Delta T1$ and $\Delta T3$, at a time point when the line offset signal 220A/220B remains inactive (FIG. 2A), or at a time point after the line offset signal 320A/320B is triggered to direct the scanning operation to the next line (FIG. 2B). The former results in a post-scan mode surface charging regulation while the later a pre-scan mode surface charging regulation.

As shown in FIG. 2A and FIG. 6A, which illustrate the post-scan mode operation in accordance with an embodiment of the present invention, after the imaging scan has been completed at the end of time period T1 (beam scan period), the sample stage remains still or the beam deflection apparatus keeps the scan position at the same line where the imaging scan was performed during time period T2 (beam retrace period) while the regulating scan, which was triggered during the transition period $\Delta T1$, is being performed during time period T2. As a result, the regulating scan is actually performed substantially at the same location as the imaging scan only after. Next, before the next imaging scan is triggered during transition period $\Delta T2$ (and then performed throughout time period T3, another beam scan period), the stage moves or the beam deflection apparatus directs the scan position to move one unit in the y-direction during the transition period $\Delta T2$ to the next line to be scanned and imaged.

Referring to FIG. 2B and FIG. 6B, which illustrate the pre-scan mode operation in accordance with an embodiment of the present invention. As shown, after the imaging scan has been completed at the end of time period T1, the sample stage moves one unit or the beam deflection apparatus directs the scan position to move one unit in the y-direction during the transition period $\Delta T1$ to the next line to be scanned and imaged. The regulation scan is triggered during $\Delta T1$ after the above action of the stage/beam deflection apparatus, and then performed throughout time period T2. The regulating scan is thus performed on the next line to be imaged during time period T2. Next, at the end of time period T2 or during the transition period $\Delta T2$ the regulating scan is disabled, and the next imaging scan is triggered and then performed on this next line to be imaged throughout time period T3. As a result, the regulating scan is actually performed substantially at the same location as the next imaging scan but before the next imaging scan is actually performed.

In FIGS. 2A and 2B, the regulating scanning operation may be performed at a different location than the imaging scanning operation in the y direction. In one embodiment, the stage may be controlled to move backwards along the y-direction so that the regulating scanning operation can be performed to the same location as the imaging scanning operation in the y direction, which here is the stage moving direction.

Figure 2C:
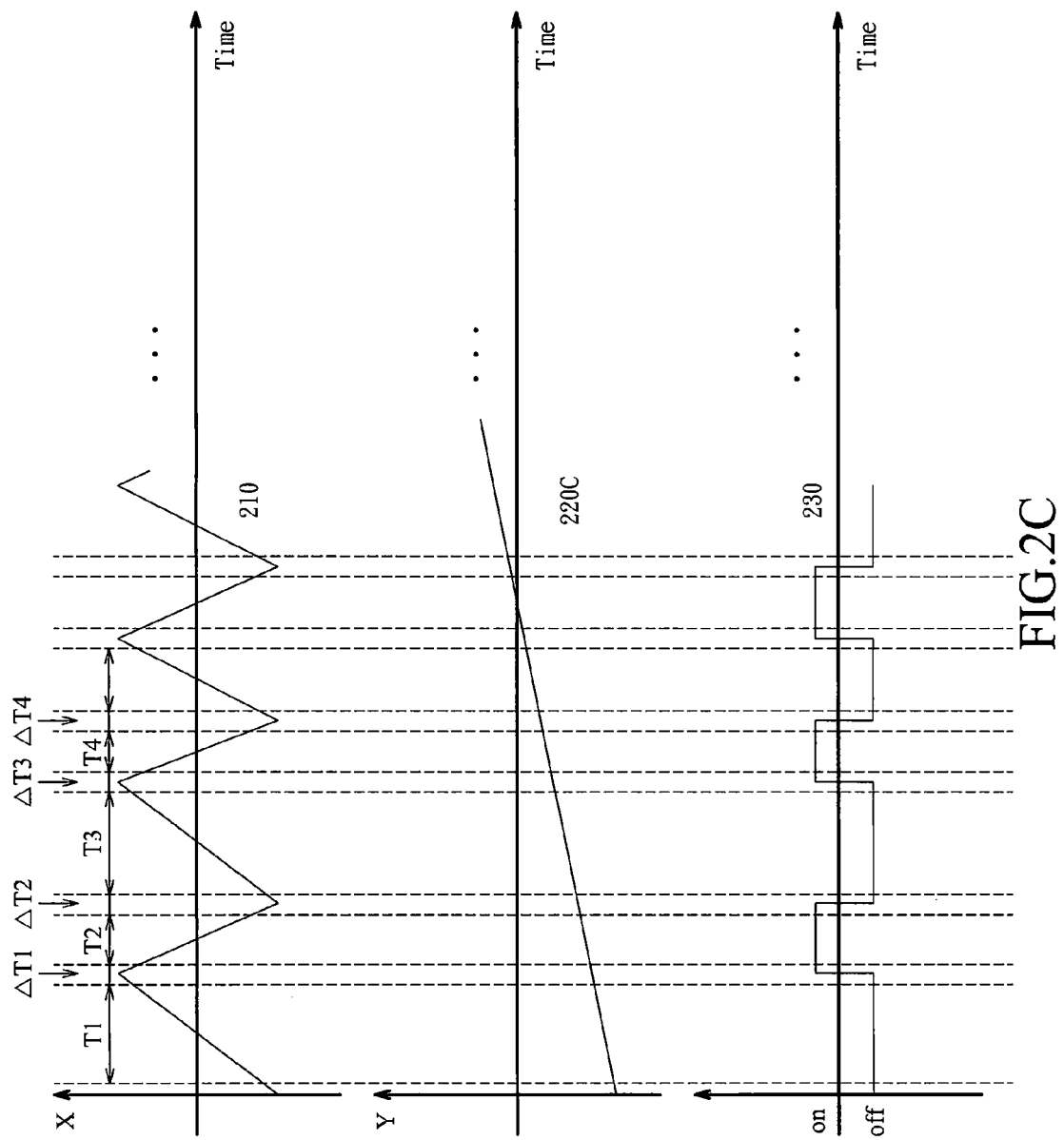
Figure 6C:
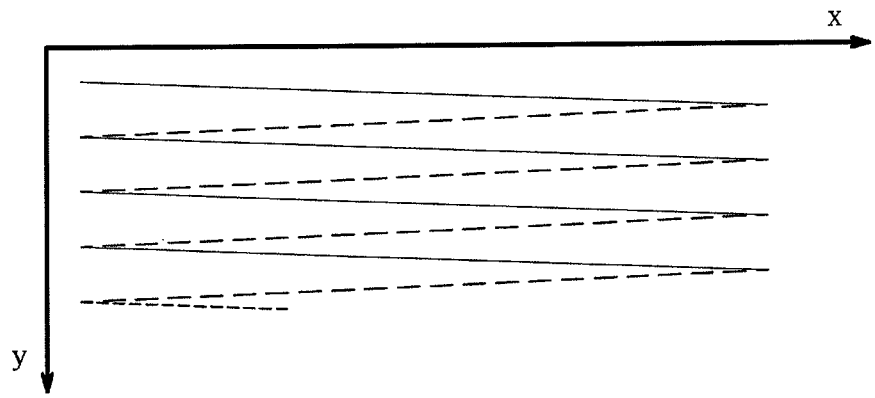
FIG. 6C illustrates a scan result in accordance with the embodiment illustrated in FIG. 2C.

In FIGS. 2A and 2B, although the position of the charged particle beam probe center is changed stepwise in the y direction as illustrated in the line offset signal 220A/220B, it can also be continuous by means of electrical scanning or stage motion. Referring to FIG. 2C, which illustrates a time sequence of triggering signals for the imaging scan, charging regulating scan and scan line offset in accordance with another embodiment of the present invention. In addition, referring to FIG. 6C, which illustrates a scan result in accordance with the embodiment illustrated in FIG. 2C, wherein the continuous lines represent the imaging scan steps, while the dashed lines represent the regulating scan steps. As shown, the illustrated triggering signals include a line scan signal 210, a regulating scan activation signal 230, and a continuous line-to-line offset signal 220C. Definition and details of line scan signal 210 and regulating scan activation signal 230 in FIG. 2C are the same as those in FIGS. 2A and 2B, and will not be repeated here.

Line-to-line offset signal 220C is here again for moving the sample stage and/or the beam center (for example by using a beam deflection apparatus) in a direction substantially perpendicular to the direction of scan lines to carry out the line-to-line offset. As shown, line-to-line offset signal 220C differs from 220A/220B in that it is a continuous signal. In other words, in the case illustrated in FIG. 2C, the line to line displacement can be achieved by line offset signal 220C through driving the stage to move continuously along the y-direction, or a beam deflection apparatus to offset the imaging beam continuously along the y-direction until all lines designated to be imaging-scanned are scanned. The bold arrows pointing to the right represent a time axis. It is noted that the scanning operation is repeatedly performed until a frame of image of the sample is formed.

In this embodiment, within one saw tooth-shaped line scan signal 210 the time duration of the forward slope signal is selected to be for the imaging scanning operation, and that of the backward slope signal is for beam retracing. As would be understood by those skilled in the art, the opposite arrangement is also a practical implementation. Therefore, in FIG. 2C, as the regulating scan activation signal 230 is triggered during the transition periods $\Delta T1$, $\Delta T3$, . . . etc. and remains active through the following time period T2, T4, . . . etc., the regulating scan is always performed during the beam retrace period. This means the imaging scan operation is always performed during the normal beam scan period T1, T3, . . . etc. Given this setting, to carry out the pre- and post-scan mode imaging process, a scanning method can be designed as the following: scanning a surface of the sample to be imaged in at least one first scan line by using a first scanning beam (imaging beam); and scanning the sample surface in at least one second scan line by using a second scanning beam (regulating beam), wherein the second scanning beam is, as mentioned earlier, scanned across the sample surface during a time interval between the end of the previous first scan lines and the beginning of the next first scan lines, the beam retrace period. This scanning operation sequence (including formation of the first and second scan lines) is repeated until a frame of image of the sample is formed.

With the first scanning beam being an imaging beam, the image of the sample is always formed from the first scan lines. Accordingly, for an imaging process to be in a post-scan mode, the image signals for forming the image of the sample should be collected starting from the "first" formed first scan lines. In such case, the scanning operation of the second scanning beam, which is a regulating beam, always follows the scanning operation of the first scanning beam, the imaging beam, thus the surface charging resulting from the previous imaging scan is always regulated by the following regulating scan, whereby the next imaging scan can be effectively performed and an improved image quality can be obtained.

On the other hand, for an imaging process to be in a pre-scan mode, the image signals for forming the image of the sample should be collected starting from the "second" formed first scan lines. In other words, at the very beginning of the foimation of the frame image, signals from the first formed first scan lines are discarded. The imaging process can be seen to start with the first formed second scan lines formed by the regulating second scanning beam. In such case, the regulating scan always precedes the imaging scan, setting a proper surface charging condition for the following imaging scan to be effectively performed thus improving the quality of image.

Figure 3B:
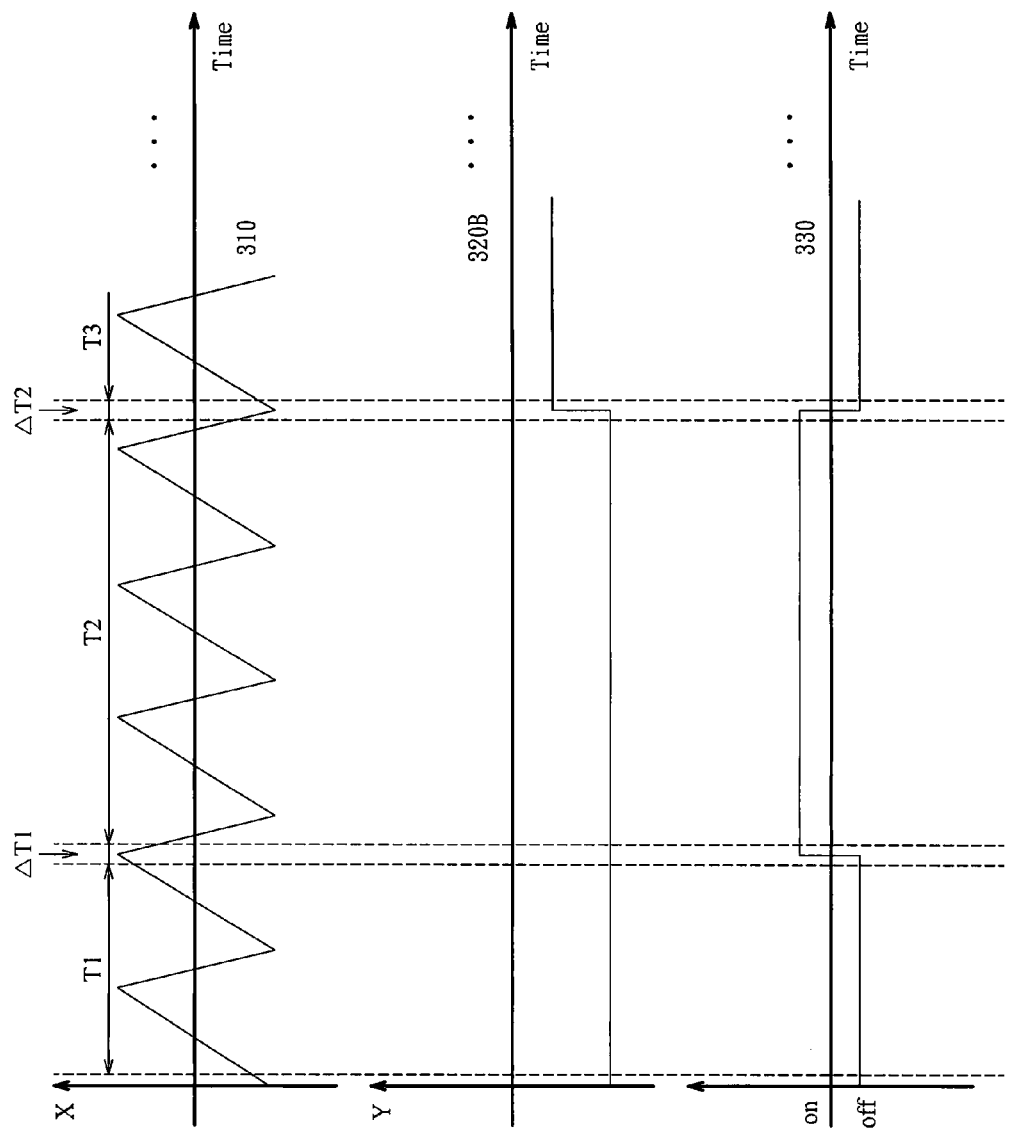
Figure 7:
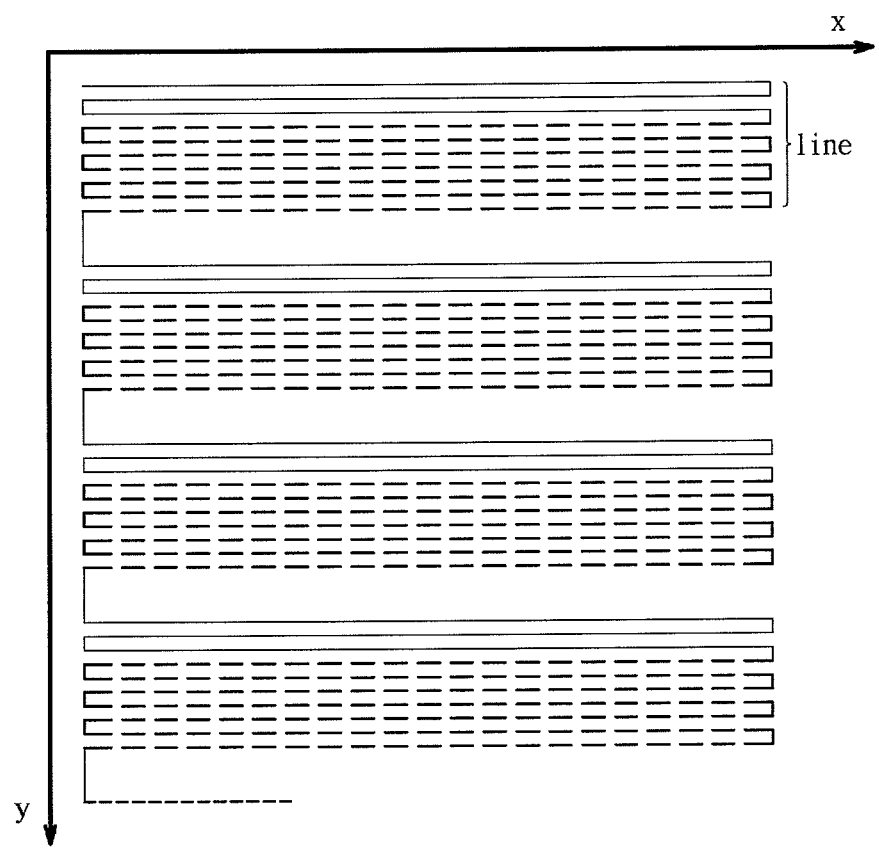
FIG. 7 illustrates a scan result in accordance with the embodiment illustrated in FIG. 3B.

Referring now to FIG. 3A and FIG. 3B which illustrate the time sequence of triggering signals for the imaging scan, charging regulating scan and scan line offset in accordance with an embodiment of the present invention. In addition, referring to FIG. 7, which illustrates a scan result in accordance with the embodiment illustrated in FIG. 3B. Similarly, as illustrated in FIG. 7, the continuous lines represent the imaging scan steps, while the dashed lines represent the regulating scan steps, and the continuous lines and the dashed lines included in the same "line" are overlapped in actual but represented as slightly apart for more clear illustration merely. As shown, the illustrated triggering signals include a line scan signal 310, a line-to-line offset signal 320A/320B, and a regulating scan activation signal 330. Definition and details of line scan signal 310 and regulating scan activation signal 330 in FIGS. 3A and 3B are the same as those in FIG. 2A through 2C, and will not be repeated here. In addition, as mentioned earlier, although in FIGS. 3A and 3B the position of the charged particle beam probe center is changed stepwise in the y direction as illustrated in the line offset signal 320A/320B, it can also be continuous by means of electrical scanning or stage motion. Further, it is noted that in both figures the scanning operation is repeatedly performed until a frame of image of the sample is formed, as illustrated by the dots on the right.

In FIGS. 3A and 3B, within one saw tooth-shaped line scan signal 310 the time duration of the forward slope signal is selected to be for the imaging scanning operation, and that of the backward slope signal is for beam retracing. As would be understood by those skilled in the art, the opposite arrangement is also a practical implementation.

In a normal scan-based charged particle beam imaging process, each imaging scanning operation is followed by an immediate beam retrace period during which the imaging scanning beam is pulled back to the starting point of the next imaging scan line to be formed. When the beam retrace period ends, the next imaging scan is performed. The beam retrace path thus exists independently and is substantially a straight line. For this kind of operation to be implemented in, for example, a post scan mode, the scanning operation sequence should comprise one imaging scan immediately followed by one regulating scan which is performed during the beam retrace period. As a result, a single imaging scan line is formed followed by a single beam retrace scan line, wherein the path of both scan lines is a straight line.

Such case is illustrated in FIG. 3A and FIG. 6A, wherein after the imaging scan has been completed during, for example, transition period $\Delta T1$ at the end of time period T1 (forward slope signal of line scan signal 310), the sample stage remains still or the beam deflection apparatus keeps the scan position at substantially the same position (or say the same line) where the imaging scan was performed during time period T2 (backward slope signal of line scan signal 310, also is the beam retrace period) under the instruction of the inactive line offset signal 320A, while the regulating scan, which was triggered by triggered regulating scan activation signal 330 also during transition period $\Delta T1$, is being performed throughout time period T2. As a result, the regulating scan is actually performed at substantially the same location as the imaging scan only after. Next, before the next imaging scan is triggered during transition period ΔT2 (and then performed throughout time period T3) by the next forward slope signal of line scan signal 310, the stage moves or the beam deflection apparatus directs the scan position to move, under the instruction of triggered line offset signal 320A, one unit in the y-direction during the transition period ΔT2 to the next line to be scanned and imaged. Other operational details of FIG. 3A are similar to those mentioned in the embodiments described in conjunction with FIG. 2A to FIG. 2C and will not be repeated here.

In this embodiment, throughout time period T1 only one (imaging) scan line would be formed because only one single forward slope signal of line scan signal 310 is triggered during time period T1. Similarly, throughout time period T2 only one (regulating) scan line would be formed because only one single backward slope signal of line scan signal 310 is triggered during time period T2. As would be understood by those skilled in the art, the formed regulating scan line would be extending along a substantially opposite direction to that of the imaging scan line because the scanning beam, be it imaging or regulating, is typically scanned back and forth as driven by the forward and backward slope signals, respectively. In addition, as shown, in this embodiment the time duration of the backward slope signal of line scan signal 310 is longer than that of the forward slope signal, indicating a slower regulating scan than the imaging scan.

In the present invention, the beam retrace period has an extended definition. The beam retrace period is defined to be any time interval during which the imaging charged particle beam probe is being directed from the end point of a previous imaging scan line to the starting point of the next imaging scan line, and no imaging scanning operation is performed during this period of time. The major difference between the definition of beam retrace period in the present invention from the above described normal imaging operation in conjunction with FIG. 3A is that in the present invention, multiple regulating scan lines may be formed between two imaging scan lines, and multiple imaging scan lines may be formed between two regulating scan lines as well. In addition, as would be understood by those skilled in the art, when this happens, the path of these scan lines would be substantially zigzag shaped because the scanning beam, be it for imaging or regulating, always travels back and forth when scanning as driven by the forward and backward slope signal of line scan signal 310, respectively.

Such case is illustrated in an example of post-scan mode operation in FIG. 3B and FIG. 7. FIG. 3B illustrates an extended imaging time period T1 during which an n-fold line average imaging scan is being performed, and an extended beam retrace time period T2 during which a m-fold regulating scan is being performed. As shown, in the case illustrated in FIG. 3B, n is equal to 2 and m is equal to 3. Also as shown, after the imaging scan has been completed during transition period ΔT1 at the end of time period T1, the sample stage remains still or the beam deflection apparatus keeps the scan position at the same line where the imaging scan was performed during time period T2 under the instruction of the inactive line offset signal 320B, while the regulating scan, which was triggered by triggered regulating scan activation signal 330 also during transition period ΔT1, is being performed throughout time period T2. As a result, the regulating scan is actually performed at the same location as the imaging scan only after. Next, before the next imaging scan is triggered during transition period ΔT2 (and then performed throughout time period T3) by the next forward slope signal of line scan signal 310, the stage moves or the beam deflection apparatus directs the scan position to move, under the instruction of triggered line offset signal 320B, one unit in the y-direction during the transition period ΔT2 to the next line to be scanned and imaged. Other operational details of FIG. 3B are similar to those mentioned in the embodiments described in conjunction with FIG. 2A to FIG. 2C and FIG. 3A, and will not be repeated here.

In this embodiment, throughout time period T1 multiple (imaging) scan lines are formed by the multiple forward and backward slope signals of line scan signal 310 triggered during time period T1. Similarly, throughout time period T2 multiple (regulating) scan lines would be formed by the multiple forward and backward slope signals of line scan signal 310 triggered during time period T2. Further, as shown these imaging and regulating scan lines are formed in a substantially zigzag shaped path, as the scanning beam, be it imaging or regulating, is typically scanned back and forth as driven by the forward and backward slope signals of line scan signal 310, respectively. Therefore, as would be understood by those skilled in the art, among the formed regulating scan lines, some would be extending along the same direction as the imaging scan lines, while others along an opposite direction to that of the imaging scan lines.

It should be noted that although specific examples of post-scan mode have been give in FIGS. 3A and 3B for illustrating the idea of allowing single and multiple regulating scan lines to be formed during the beam retrace period as in accordance with some embodiments of the present invention, similar idea and rations may be applied to the pre-scan mode operations as well.

The proposed method described in conjunction with FIG. 2, FIG. 3, FIG. 6, and FIG. 7 can be implemented in the form of a controller which is coupled to a general charged particle beam imaging system 100 as illustrated in FIG. 1. The controller can be implemented as a pure hardware such as an independent IC, a firmware or a pure computing program. For example, the controller can be implemented to comprise a computer readable medium encoded with a computer program, wherein the program is able to instruct and coordinate relevant components in charged particle beam imaging system 100 so as to carry out the details of the proposed method as described in those embodiments in conjunction with FIG. 2, FIG. 3, FIG. 6 and FIG. 7.

In practice, referring to FIG. 1 again, the computer program may be designed to instruct charged particle beam imaging system 100 such that sample 195 is first scanned in at least one first scan lines by using a first scanning beam, and then is scanned in at least one second scan lines by using a second scanning beam, wherein the second scanning beam is, as mentioned earlier, scanned across the sample surface during a time interval between the end of the previous first scan lines and the beginning of the next first scan lines, the beam retrace period. This scanning operation sequence (including formation of the first and second scan lines) is repeated until, for example, a frame of image of sample 195 is formed.

In one embodiment, the first scanning beam is for imaging scan and the second scanning beam is for regulating scan. Therefore, as has been described earlier, for a post-scan mode, the image of sample 195 is formed from the first formed first scan lines, and surface charging resulting from the previous imaging scan is regulated by the second scanning beam. For a pre-scan mode, the same scanning operation sequence is performed. The image of sample 195 can be designed to still be formed from the first scan lines, only this time at the very beginning of formation of the frame image, signals from the first formed first scan lines are discarded. In other words, surface charging of sample 195 is first regulated by the first formed second scan lines, and then sampling of sample 195 starts from the second formed first scan lines. The process then proceeds to repeat until a designated frame of image of sample 195 is formed.

As mentioned earlier, the first and second scanning beam would induce a first and second charging condition to the sample surface, respectively, and when the surface charging regulation is performed, for example in a post-scan mode, the second charging condition interacts with the first charging condition to form a net charging condition, wherein the net charging condition provides a desirable charging environment for the next imaging scanning operation. The detail of surface charging regulation has been described in detail in the previous sections and will not be repeated here.

In addition, as has been described in conjunction with FIG. 2, FIG. 3, FIG. 6 and FIG. 7, the regulating scan may be performed at the same location as the imaging scan on sample 195, or it may be performed in the vicinity of the imaging scan location. In other words, the second scan lines may overlap with the first scan lines, or they may locate away from the first scan lines. It is noted however, that the effective coverage of the regulating (second) scanning beam should include an area at least covering the previous imaging (first) scan line(s) or the next line(s) to be imaging-scanned, so as to sufficiently regulate the surface charging of the sample thereby rendering a better image quality for the subsequent imaging scanning.

Also, as illustrated in FIG. 3A and FIG. 6A, in some embodiments of the present invention, single regulating scan line may be formed between two imaging scan lines and single imaging scan line may be formed between two regulating scan lines, while in other embodiments, as illustrated in FIG. 3B and FIG. 7, multiple regulating scan lines may be formed between two imaging scan lines, and multiple imaging scan lines may be formed between two regulating scan lines as well. In the later case, the path of the formed regulating scan lines is substantially zigzag shaped, thus the formed regulating scan line may extend along a direction substantially the same as or opposite to that of the imaging scan line. In other words, the second scan line may extend along a direction substantially the same as or opposite to that of the first scan line.

Recall that in the present invention, a beam retrace period is defined to be a time interval during which the imaging charged particle beam probe is being directed from the end point of a previous imaging line to the starting point of the next imaging line, and no imaging scan is performed during such period of time. Also recall that in the embodiments of the present invention, single or multiple regulating scan lines may be formed during the beam retrace period. From the view point of execution of a computer program, the time period of the second scanning operation (forming the second scan lines) may be defined to be the beam retrace period for convenience. As a result, the second scanning beam is scanned across the sample surface during a time interval between the end of the previous first scan lines and the beginning of the next first scan lines.

Figure 4:
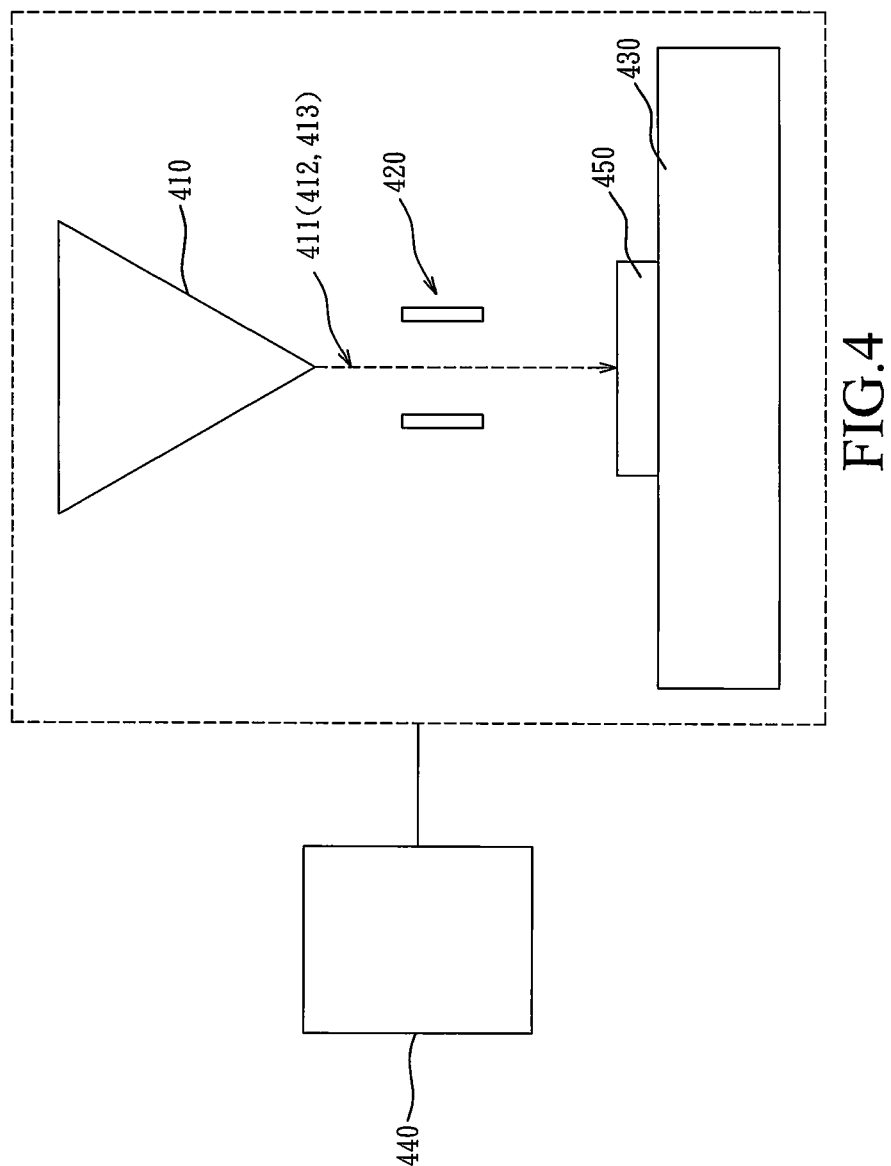
FIG. 4 is an illustration of a charged particle beam imaging system in accordance with an embodiment of the present invention.

Referring to FIG. 4 which is an illustration of a charged particle beam imaging system 400 in accordance with an embodiment of the present invention. As shown, charged particle beam imaging system 400 at least comprises a scanning beam probe provider 410, a deflection module 420, a stage 430 and a controller 440. Scanning beam probe provider 410 is for providing a scanning beam probe 411 which at least comprises a first scanning beam probe 412 and a second scanning beam probe 413 (not shown separately). To provide these beam probes, beam probe provider 410 may comprise at least one beam source and a beam condensing/focusing optical lens assembly. Deflection module 420 is for scanning the provided scanning beam probe 411 across a surface of a sample 450 placed on stage 430 for imaging. Controller 440 is at least coupled with the scanning beam probe provider 410, deflection module 420 and stage 430. To perform charged particle beam imaging using imaging system 400, controller 440 instructs and coordinates scanning beam probe provider 410 to provide scanning beam 411, deflection module 420 to deflect thereby scanning the provided scanning beam probe 411 across the surface of sample 450, and stage 430 to be in relative motion with scanning beam probe 411.

As mentioned earlier, scanning beam probe 411 comprises at least two scanning beam probes, the first scanning beam probe 412 and the second scanning beam probe 413. In practice, one of these two beam probes is used for imaging sample 450, and the other is used for regulating the sample surface charging. Recall that the imaging beam probe must be a charged particle beam probe, for example an electron or ion beam probe. If scanning beam probes 412 and 413 are both an electron beam or ion beam, controller 440 may instruct scanning beam probe provider 410 to make these two beam probes differ from one another in at least one of the beam conditions such as beam landing energy, beam current density, beam focus, beam spot size, beam incident angle at sample surface, etc., so that they can carry out their respective functions of imaging and regulating scan. Moreover, to provide individual scanning beam probes 412 and 413, scanning beam probe provider 410 may comprise separate beam sources each generating one of these two beams. Alternatively, if scanning beams 412 and 413 are of the same type such as an ion beam or electron beam, they may originate from one single beam source included in beam probe provider 410.

In one embodiment, during the imaging of sample 450, controller 440 controls beam probe provider 410 or say the beam source therewith to control the on/off status of individual beam probe 412 and 413. This can be done through, for example switching on and off the beam source or functioning of a beam blanking device included in beam probe provider 410. Alternatively, if beam probes 412 and 413 are the same beam probe but of different beam conditions as described earlier, the on/off status can be controlled by controller 440 instructing beam probe provider 410 to change the beam condition for example through adjusting the beam condensing/focusing optical lens assembly therewithin in a real time fashion. As a result, the imaging and regulating actions performed by individual of beam probes 412 and 413 can be alternatively carried out and delivered to the sample surface.

In one embodiment, controller 440 comprises a computer readable medium encoded with a computer program for carrying out the proposed method as in the embodiments described in conjunction with FIG. 2, FIG. 3, FIG. 6 and FIG. 7. Accordingly, controller 440 can coordinate the relevant components of charged particle beam imaging system 400, for example the scanning beam source 410, the deflection module 420, and the stage 430 to perform charged particle beam imaging of sample 450 in accordance with the details in the embodiments of the present invention as those described earlier.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for enhancing the quality of a charged particle microscopic image of a sample, comprising:

a first scanning step, using a first scanning beam with a first landing energy to perform a first number of continuous repetitions of scanning, back-and-forth between a first location point on said sample and a second location point on said sample; and a second scanning step, using a second scanning beam with a second landing energy to perform a second number of continuous repetitions of scanning back-and-forth between said first location point and said second location point after said first image scanning step;

wherein one of said first scanning step or said second scanning step regulates a surface charging condition of said sample and the other is used to image said sample.

2. The method of claim 1, wherein said first scanning step and said second scanning step are repeated until an image frame of said sample is formed.

3. The method of claim 2, wherein said image frame of said sample is formed from a plurality of said first scanning steps.

4. The method of claim 3, wherein said image frame of said sample is formed starting from the second of said plurality of said first scanning steps.

5. The method of claim 3, wherein said second scanning beam is off during said first scanning step and both said first scanning beam and said second scanning beam are on during said second scanning step.

6. The method of claim 3, wherein said first scanning beam is an ion beam.

7. The method of claim 3, wherein said second scanning beam is an electromagnetic beam.

8. The method of claim 1, wherein said first scanning beam and said second scanning beam induce a first charging condition and a second charging condition on said sample surface, respectively, wherein said second charging condition has the same electric charge polarity as said first charging condition, and the introduction of said second charging condition to said sample surface enhances said first charging condition.

9. The method of claim 1, wherein said first scanning beam and said second scanning beam induce a first charging condition and a second charging condition on said sample surface, respectively, wherein said second charging condition has a different electric charge polarity than that of said first charging condition, such that the introduction of said second charging condition to said sample surface mitigates, eliminates or reverses existing said first charging condition.

10. The method of claim 1, wherein said first scanning step commences at said first location point and finishes at said second location point, and said second scanning step commences at said second location point and finishes at said first location point.

11. The method of claim 1, wherein said first scanning beam and said second scanning beam are charged particle beams and are originated from a same source, said first scanning beam and said second scanning beam differing in beam landing energy, beam current density, beam focus, beam spot size, or beam incident angle at said surface of said sample.

12. A charged particle beam imaging system enhancing image quality during charged particle beam imaging of a sample, comprising:

a scanning beam probe provider for providing at least a first scanning beam and
a second scanning beam;

a deflection module, for deflecting said first scanning beam and said second scanning beam across a surface of said sample;

a stage, whereupon said sample is secured for imaging; and a controller, for coordinating said first scanning beam, said second scanning beam, said deflection module and said stage such that said sample surface is scanned to continuously form a plurality of first scan lines between a first location point on said sample and a second location point on said sample by said first scanning beam, and then is scanned to continuously form a plurality of second scan lines between said first location point and said second location point by said second scanning beam, wherein said second scanning beam is scanned across said sample surface during a time interval between the end of previous said first scan lines and the beginning of the next said first scan lines, and said first scan lines or said second scan lines are used to regulate a surface charging condition of said surface and the other to image said surface.

13. The charged particle beam imaging system of claim 12, wherein said controller instructs said scanning beam probe provider, said deflection module and said stage to alternate scanning by said first scanning beam and said second scanning beam until a frame of image of sample is formed.

14. The charged particle beam imaging system of claim 13, wherein said controller coordinates said scanning beam probe provider, said deflection module and said stage such that said frame of image of said sample is formed from said first scan lines.

15. The charged particle beam imaging system of claim 14, wherein said controller coordinates said scanning beam probe provider, said deflection module and said stage such that said frame of image of said sample is formed starting from the second formed said first scan lines.

16. The charged particle beam imaging system of claim 12, wherein one of said first scanning beam and said second scanning beam is for imaging said sample and comprises an ion beam or electron beam, and the other of said first scanning beam and said second scanning beam is for regulating the surface charging of said sample and comprises one selected from a group consisting of the following, or any combination thereof: optical beam, electromagnetic radiation, electron beam, ion beam.

17. The charged particle beam imaging system of claim 12, wherein both said first scanning beam and said second scanning beam comprise an electron or ion beam and, said controller instructs said scanning beam probe provider such that said first scanning beam and said second scanning beam differ in at least one beam condition selected from a group consisting of the following, or any combination thereof: beam landing energy, beam current density, beam focus, beam spot size, beam incident angle at said sample surface.

18. The charged particle beam imaging system of claim 12, wherein said first scanning beam and said second scanning beam induce a first and second charging condition on said sample surface, respectively, wherein said second charging condition has the same electric charge polarity as said first charging condition, such that the introduction of said second charging condition to said sample surface enhances said first charging condition.

19. The charged particle beam imaging system of claim 11, wherein said first scanning beam and said second scanning beam induce a first and second charging condition on said sample surface, respectively, wherein said second charging condition has a different electric charge polarity than that of said first charging condition, such that the introduction of said second charging condition to said sample surface mitigates, eliminates or reverses existing said first charging condition.

20. The charged particle beam imaging system of claim 12, wherein said scanning beam probe provider comprises a first beam source for generating said first scanning beam, and a separate second beam source for generating said second scanning beam.

* * * * *